United States Patent [19]
Sato

[11] Patent Number: 5,376,860
[45] Date of Patent: Dec. 27, 1994

[54] PIEZOELECTRIC SENSOR

[75] Inventor: Hidetoshi Sato, Tokyo, Japan

[73] Assignee: Oki Ceramic Industry Co, Ltd., Tokyo, Japan

[21] Appl. No.: 135,433

[22] Filed: Oct. 12, 1993

[30] Foreign Application Priority Data

Oct. 19, 1992 [JP] Japan .................. 4-279660

[51] Int. Cl.$^5$ .................................. H01L 41/08
[52] U.S. Cl. .................... 310/346; 310/338; 310/344
[58] Field of Search ............. 310/344, 346, 334–339

[56] References Cited

U.S. PATENT DOCUMENTS

| | | | |
|---|---|---|---|
| 3,390,287 | 6/1968 | Sonderegger | 310/346 X |
| 3,441,754 | 4/1969 | Heny | 310/346 X |
| 3,624,264 | 11/1971 | Lazarus | 310/339 X |
| 3,876,891 | 4/1975 | Schubotz | 310/346 X |
| 3,935,484 | 1/1976 | Leschek et al. | 310/346 X |
| 4,462,247 | 7/1984 | Hattori et al. | 73/35 |
| 4,551,647 | 11/1985 | Day | 310/346 X |
| 4,578,611 | 3/1986 | Sadler | 310/338 |
| 4,672,839 | 6/1987 | Takeuchi et al. | 73/35 |
| 4,825,117 | 4/1989 | Thomas, III et al. | 310/346 |
| 5,038,069 | 8/1991 | Lukasiewicz et al. | 310/338 |

FOREIGN PATENT DOCUMENTS

55-135718 10/1980 Japan .

Primary Examiner—Mark O. Budd
Attorney, Agent, or Firm—Edward D. Manzo; Ted K. Ringsred

[57] ABSTRACT

A piezoelectric sensor for detecting vibrations is disclosed, the sensitivity of which is less temperature dependent than that in the prior art even when it is used in a broad temperature range. A lower member made of alumina is secured by an epoxy type adhesive to the inner bottom surface of a vessel made of an iron-nickel alloy containing 42% by weight of nickel. A piezoelectric element using a PZT piezoelectric body is secured by an adhesive to the lower member 33. An upper member made of alumina having electrodes is secured to the piezoelectric element with the electrodes of the upper member and those of the piezoelectric element soldered to one another. The plan dimensions of the upper and lower members are slightly greater than those of the piezoelectric element. On the lamination including the piezoelectric element and lower and upper members, a thermally shrinkable tube is fitted, thus forming spaces adjacent the top surface and periphery of the piezoelectric element. In this state, the piezoelectric element and so forth are sealed with a resin.

8 Claims, 12 Drawing Sheets

FIG_2

FIG_3

FIG_8

FIG_10

FIG_11

FIG. 12

FIG_13

PIEZOELECTRIC SENSOR

BACKGROUND OF THE INVENTION

1. Field of the Invention

This invention relates to piezoelectric sensors such as AE (acoustic emission) sensors, ultrasonic sensors, vibration sensors, etc. using piezoelectric materials.

2. Description of Related Art

Piezoelectric sensors for converting slight vibrations and stress of objects under measurement into electric signals with the piezoelectric effect of their materials find applications in various fields. In an example of an application, the piezoelectric sensor is mounted in a mechanically operable apparatus for detecting abnormal vibrations that may be caused when an abnormal operation takes place in the machine.

Figure 12:
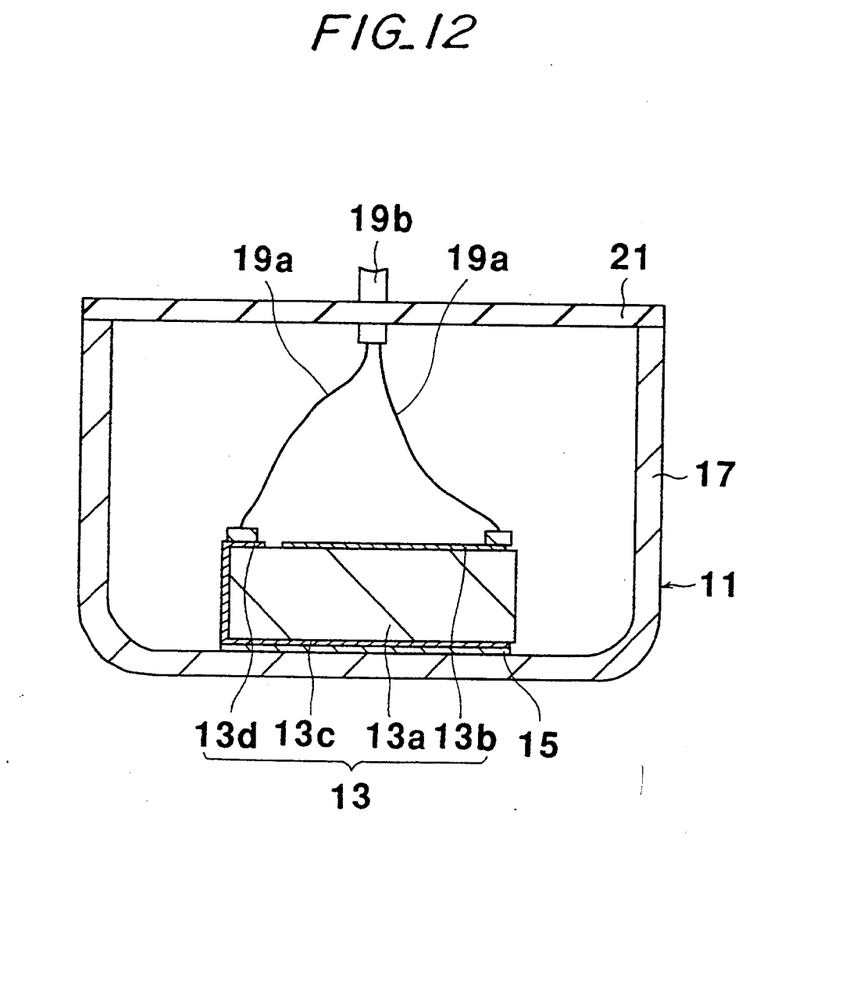
FIG. 12 is a sectional view for explaining our proposed but unknown piezoelectric element.
Figure 13:
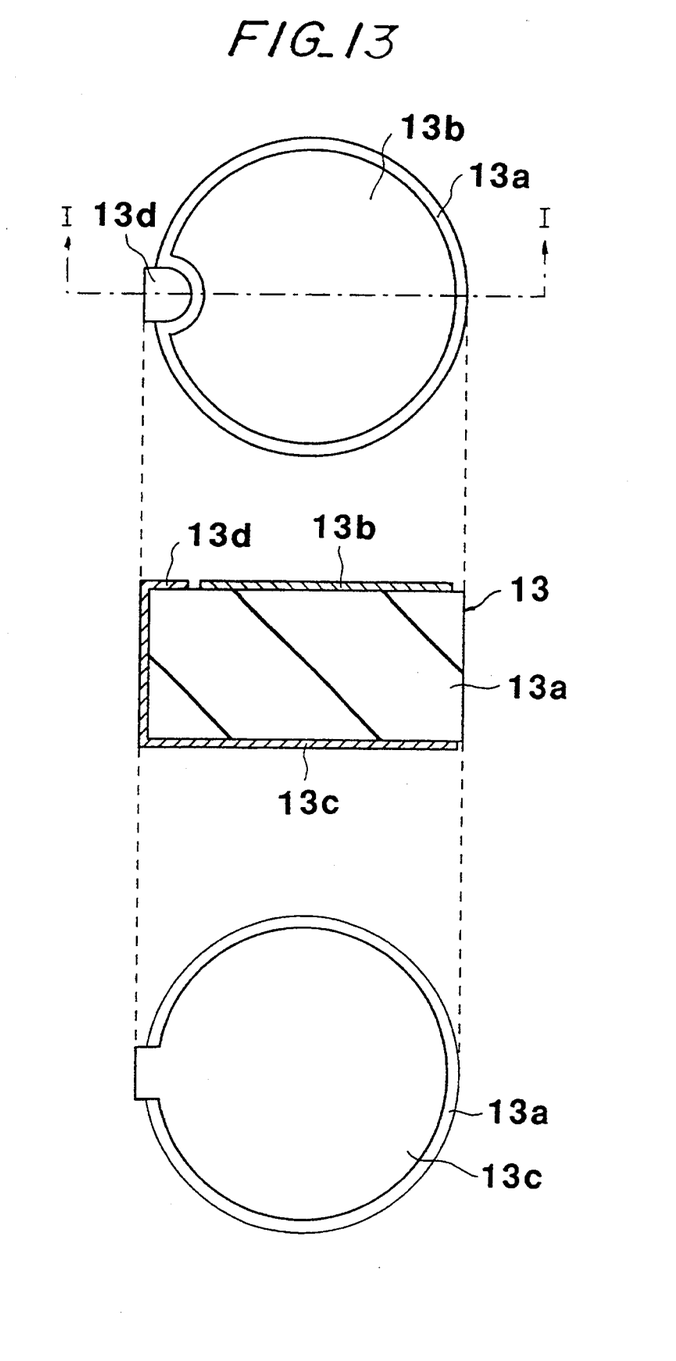
FIG. 13 is a view for explaining a piezoelectric element portion in the prior art and according to the invention.

The inventor has proposed a piezoelectric sensor which is used in this way. FIGS. 12 and 13 show this proposed sensor, but the sensor has not been known or sold in Japan and foreign country. Specifically, FIG. 12 is a schematic sectional view showing the overall structure of the piezoelectric sensor, and FIG. 13 shows a piezoelectric element provided in the piezoelectric sensor in a top view, a bottom view and a sectional view taken along line I—I in the top view.

The piezoelectric sensor 11 comprises a piezoelectric element 13, a support (i.e., a vessel) 17, to which the element 13 is secured by securing means 15, e.g., an adhesive, inner leads 19a connected to a first and a second electrode 13b and 13c of the element 13, outer leads 19b connected to the inner leads 19a, and a lid 21 of the vessel 17.

In this example, the piezoelectric element 13 includes a piezoelectric body 13a having a disk-like shape, the first and second electrodes 13b and 13c being provided on the opposite surfaces of the piezoelectric body 13a. In the instant piezoelectric element 13, a portion 13d of the second electrode 13c is on the surface of the body 13a, and the first electrode 13b of the piezoelectric body 13a is also formed on that same surface. The piezoelectric body 13a is often made of piezoelectric ceramics, for instance of lead zirconate titanate. The piezoelectric body 13a has such dimensions that it readily resonates at the frequency of abnormal vibration desired to be detected. The first and second electrodes 13b and 13c are often made of sintering of silver paste.

The vessel 17 is often made of iron because it requires only an inexpensive material expenditure.

The inner leads 19a are often made from a wire having a very small diameter in order to alleviate as much as possible the transfer of its stress to the piezoelectric element 13. The outer leads 19b are often made from a sielded wire thicker than the inner leads 19a, which is advantageous from the standpoints of the durability and measures against noise. One end of the outer leads 19b is secured to the lid 21 and connected to the inner leads 19a in the neighborhood of the lid 21.

However, as a result of extensive research and investigation conducted by the inventor in connection with this application, it has been found that the already proposed piezoelectric sensor as described above has the following problems.

(1) An increase of the temperature range of the working environment, in which the piezoelectric sensor is used, will increase the temperature dependency of the sensitivity of the piezoelectric sensor (comparative examples described later being referred to for details). Therefore, it becomes impossible to obtain measurements as described.

(2) Since the wiring has a structure requiring separate inner and outer wirings, its production is cumbersome. In addition, it is difficult to ensure reliability of the connection between these two wirings.

(3) The inner leads have to be made from a very small diameter wire, and therefore their ability to withstand vibration (durability) is inferior.

(4) To alleviate the influence of the temperature, it is thought to use the piezoelectric sensor in a state accommodated in a suitable protector. However, when such a protector is used, the piezoelectric sensor is correspondingly increased in shape. In addition, the sensitivity is reduced.

A piezoelectric sensor used in a stringent environment, for instance one for detecting abnormal operation of an apparatus installed in an automotive engine compartment, is required to permit measurements in a broad temperature range, for instance from $-40°$ to $+150°$ C., as well as being durable and small in size. Therefore, the solution of the above problems has been desired.

SUMMARY OF THE INVENTION

The present invention addresses the above problems.

A first object of the invention is to provide a piezoelectric sensor of which the sensitivity is less temperature dependent than already proposed piezoelectric sensors.

A second object of the invention is to provide a piezoelectric sensor with superior durability compared to that in the prior art.

To attain the stated first object of the invention, according to one aspect of the invention there is provided a piezoelectric sensor, which comprises a piezoelectric element and a support, to which the piezoelectric element is secured, a measurement signal being obtained from an object under measurement via the support, the support being made of a material having a thermal expansion coefficient equal to or near that of a piezoelectric body used for the piezoelectric element.

According to the invention, the support may be any member which is interposed between the object under measurement and the piezoelectric element and to which the piezoelectric element is secured. This is so because the shape, size and thickness of the support can be suitably selected in dependence on the purpose and design of the piezoelectric sensor. For example, the vessel as shown in FIG. 12 and, in case of providing a lower member between vessel 17 and piezoelectric element 13, the portion constituted by such lower member and piezoelectric element, can be thought to be a support. Further, depending on the design of the piezoelectric sensor, there is a case of using only a single plate as a support. Of course such a plate also can be a support. An example of the lower member is an insulating member for electrically insulating the vessel and piezoelectric element.

Further, according to the invention, the term "making a support of a material having a coefficient of thermal expansion equal to or near that of piezoelectric body" means either making the entire support of such a predetermined material, making a portion of the support, to which the piezoelectric element is secured, of such a predetermined material or, in case of a support including a vessel and a lower member, making at least the lower member of such a predetermined material. In the case of a support including a vessel and a lower member, it is thought to be suitable to make the lower member of material having a thermal expansion coefficient equal to or near that of the object under measurement while making the vessel of a material having a thermal expansion coefficient intermediate between those of the vessel and piezoelectric body. This is so because it is thought that the thermal expansion coefficient can be matched step-wise from that of the object under measurement to that of the piezoelectric element.

Further according to the invention, the similarity to the thermal expansion coefficient of the piezoelectric body is determined in a range required to obtain necessary characteristics of the piezoelectric sensor. Although not limitative, a material having a thermal expansion coefficient in a range of 10 to 1/10 times the thermal expansion coefficient of the piezoelectric body is thought to be in the similarity range.

Further, according to the invention, in the case of a support comprising a plurality of different members (for instance a vessel and a lower member), the individual materials forming the members have their respective thermal expansion coefficients equal to or near that of the piezoelectric body. And the materials themselves may be same or not same to each other. However, there are materials suitable to the vessel and lower member depending on the purpose, processing in manufacture and other considerations. Therefore, it is thought in practice that in many cases the individual components of the support may consist of different materials (of course with their thermal expansion coefficients in a predetermined range).

Further, according to the invention, the lower member may comprise a plurality of sub-members. In such a case, the materials of the sub-members are selected so that their thermal expansion coefficients vary step-wise or progressively from the side nearest to the object under measurement toward that of the piezoelectric body. Where the lower member comprises a plurality of sub-members, the number of sub-members may be suitably determined by taking account of the sensitivity of the piezoelectric sensor.

Further, to attain the second object of the present invention, it is further suitable to add the following features (a) to (c) to the features of the invention mentioned above.

(a) To provide, on the side of the piezoelectric sensor on the side thereof opposite the lower member, an upper member which is made of a material having a thermal expansion coefficient equal to or near that of the piezoelectric body, and which has an electrode connected to an electrode of the piezoelectric element.

(b) To space apart the piezoelectric element and the upper member such as to form an intervening space or provide an intervening insulator.

(c) To connect an outer wiring to the electrode of the upper member.

The space between the piezoelectric element and upper member is suitably formed by making use of the height of the portion of connection between the electrode of the piezoelectric element and that of the upper member.

Further, when carrying out the invention, it is further suitable to add the following structures (d) to (f).

(d) To use both the lower and upper members.

(e) In the case of a lamination comprising the lower member, the piezoelectric element and an upper member, to provide a cover member around the lamination such as to form a space or separation therearound.

(f) To seal the lamination covered by the cover member with a seal member.

Suitably, the lower and upper members are formed such that their plan outer dimensions are greater than those of the piezoelectric element so as to utilize the dimensional difference for forming the space or separation around the sides of the piezoelectric element.

According to the invention, the support which is in contact with the piezoelectric element (for instance the vessel or the lower member) is made of a material with a thermal expansion coefficient equal to or near that of the piezoelectric body. This arrangement tolerates even a great temperature change in the working environment of the piezoelectric sensor, because the stress resulting from the thermal expansion coefficient difference between the support and piezoelectric body is reduced. It is thus possible to obtain improvement of the temperature dependency of the piezoelectric sensor sensitivity compared to the prior art. Further, even in working environments subject to great temperature changes, there is no need of using any special protector.

Further, where the upper member with the outer wiring connected thereto is provided with a space or a play provided over the piezoelectric element, according to one aspect of this invention, the upper member can substantially eliminate the stress from above the piezoelectric element. Thus it is possible to make the outer wiring firmer, for instance, by using a wire having an increased diameter or even by using a printed circuit board.

Further, in an embodiment using the lower and upper members, covering the piezoelectric element with a space or a play formed therearound, and sealing the element with a seal member, it is possible to mold the element with a space held over and around the piezoelectric element. Thus, it is possible to shield the piezoelectric element from the working environment with reduced adverse effects of the seal member on the piezoelectric element.

BRIEF DESCRIPTION OF THE DRAWINGS

In describing the invention, reference is made of accompanying drawings wherein.

DETAILED DESCRIPTION OF THE PREFERRED EMBODIMENTS

Preferred embodiments of the piezoelectric sensor according to the invention will be described along with comparative examples. The drawings used for the description are mere representations of the size, shape and dispositional relation of components only schematically to such an extent as to permit understanding of the invention. In the Figures, like parts are designated by like reference numerals. Further, parts like those in the prior art structure are designated by like reference numerals. Such parts may sometimes not be described to avoid repeated description. Further, materials used, dimensions and the numerical values representing conditions are only examples within the scope of the invention.

1. FIRST EMBODIMENT

Figure 1:
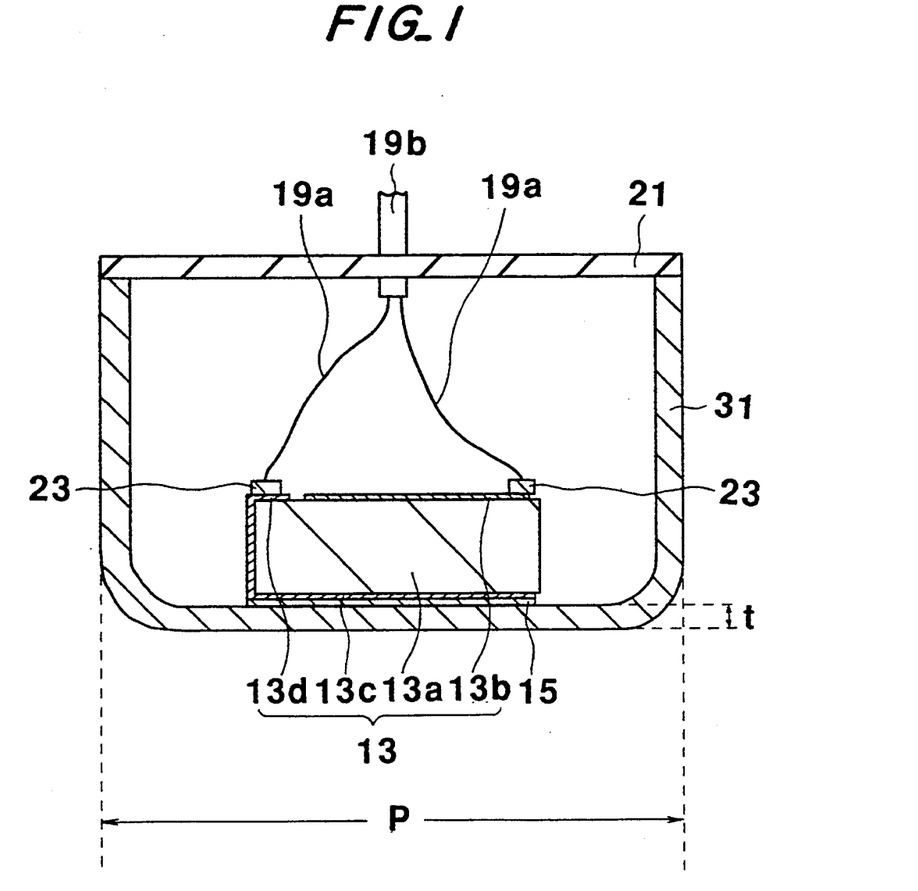
FIG. 1 is a sectional view showing a piezoelectric sensor for explaining first and second embodiments of the invention.

FIG. 1 is a schematic sectional view showing an embodiment (first embodiment) having a simple construction according to the invention. The sectional view is taken such that the section of the piezoelectric element in the piezoelectric sensor corresponds in section to the sectional view taken along line I—I in FIG. 13. (This is applicable to the sectional views of the following embodiments.)

FIG. 1 shows a support 31, in this instance a vessel open at the top (to be described later in detail). Also shown are a piezoelectric element 13, a securing means 15, inner leads 19a, outer leads 19b and a lid 21. The details of the components 31 and 13 to 19a and 19b are as follows.

The piezoelectric element 13, like the one described in connection with FIG. 13, comprises a piezoelectric body 13a and electrodes 13b and 13d. The piezoelectric body 13a is made preferably of lead zirconate titanate (PZT). Illustratively, its diameter is 10 mm, and its thickness ranges from 1 to 3 mm. The coefficient of thermal expansion of the piezoelectric body 13a is roughly $5 \times 10^{-6}/°C$. (generally $1 \times 10^{-6}$ to $8 \times 10^{-6}/°C$.). Since the piezoelectric body 13a has an illustrative thickness of 1 to 3 mm, its resonant frequency is generally in the range of 100 to 2,000 kHz. The electrodes 13b to 13d of the piezoelectric element 13 are made by sintering of silver paste. The piezoelectric bodies used in this first embodiment as well as the following embodiments and comparative examples are obtained by weighing, mixing and sintering a materials in the same steps and in well-known methods.

The vessel 31 is made of a material having a coefficient of thermal expansion equal to or near that of the piezoelectric body material. In this embodiment, it is made of an alloy of iron (Fe) and nickel (Ni) (containing 42% by weight of Ni). Its outer size (i.e., dimension shown at P in FIG. 1) is set preferably to 13 and 14 mm, and the thickness t of its bottom (see FIG. 1) is set preferably to 0.4 and 0.5 mm. The alloy has a thermal expansion coefficient of $5 \times 10^{-6}/°C$., which is substantially equal to that of the piezoelectric body 13a.

The preferred securing means 15 is an epoxy type adhesive with a thermal expansion coefficient of $6 \times 10^{-5}/°C$. However, this illustrative material is by no means limitative, and it is possible to use any suitable material depending on the design.

The inner leads 19a are formed as a strand of three wires each illustratively 0.1 mm in diameter, the strand having a diameter illustratively of 0.2 mm (which is a conventional strand). The outer lead 19b is a shielded wire with a core wire diameter of 0.6 mm illustratively. It has one end secured in a suitable way to the lid 21.

In one illustrative manufacture process, piezoelectric element 13 is secured by adhesive 15 to the inner bottom surface of vessel 31. Then the inner leads 19a are connected to the first electrode 13b of the piezoelectric element 13 and the led-out portion 13d of the second electrode 13c by using connecting means 23 (for instance, by soldering with solder 23). Then the other ends of the inner leads 19a are soldered to the outer wiring 19b, and then the lid 21 is assembled. In this way, the first embodiment of the piezoelectric sensor is obtained.

Figure 4:
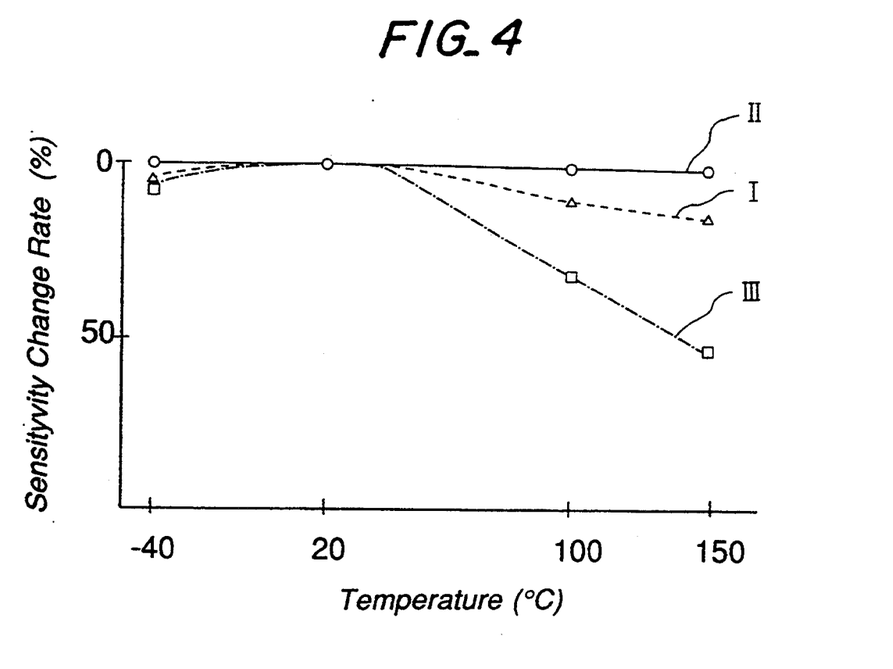
FIG. 4 is a graph showing results of experiments considering sole support in the embodiments and a comparative example.

Then, the first embodiment of the piezoelectric sensor is secured by a predetermined method of securing to a vibration system (not shown) which generates vibrations at a predetermined frequency, and then the vibration system and the piezoelectric sensor are put into a variable temperature trough (not shown) which is capable of temperature variation. Then, the temperature in the variable temperature trough is set to a plurality of different temperatures in a range of $-40°$ to $+150°$ C. including a temperature of 20° C., and the output from the piezoelectric sensor is measured at each of these temperatures. This measurement is hereinafter referred to as "sensitivity-temperature characteristic measurement". The output value at each preset temperature is converted into a change rate with respect to the output at 20° C. At main measurement temperatures, the sensitivity-temperature characteristic measurement change rate of the first embodiment of the piezoelectric sensor was $-5\%$ at $-40°$ C., $-10\%$ at $+100°$ C. and $-15\%$ at $+150°$ C. Similar characteristics could be obtained with samples which were obtained by changing the thickness of the bottom of the vessel 31 and the outer dimensions thereof. FIG. 4 shows the sensitivity-temperature characteristics of the first embodiment of the piezoelectric sensor by a curve I, with the ordinate showing the sensitivity change rate and the abscissa showing the temperature. FIG. 4 also shows the characteristics of the following Comparative Example 1 and second, third and fourth embodiments.

2. SECOND EMBODIMENT

The second embodiment of the piezoelectric sensor was produced in the same way as in the first embodiment except that "Kovar" (an alloy composed of 54 wt. % of iron, 29 wt. % of nickel and 17 wt. % of cobalt) was used as the material of the vessel 31, and its sensitivity-temperature characteristic was measured in the same manner as in the first embodiment. The thermal expansion coefficient of "Kovar" is $5.3 \times 10^{-6}/°C$., which is substantially equal to that of the alloy in the first embodiment.

It was found that the temperature dependency of the sensitivity of the second embodiment of the piezoelectric sensor was substantially the same as that of the first embodiment.

3. THIRD EMBODIMENT

Figure 2:
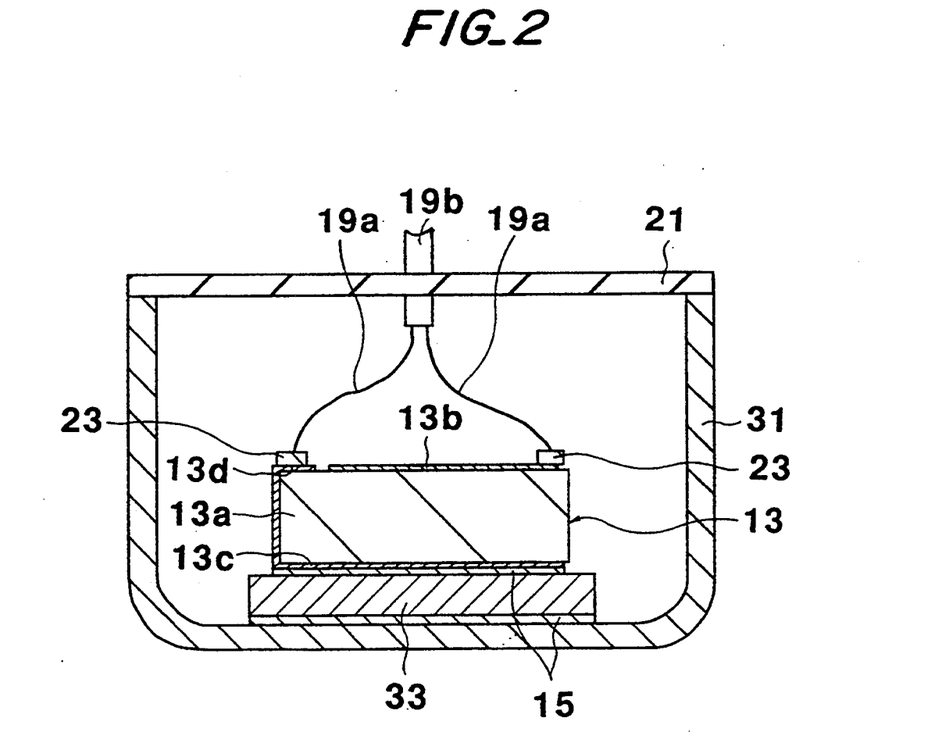
FIG. 2 is a sectional view showing a third embodiment of the piezoelectric sensor according to the invention.

In a third embodiment, a lower member 33 is provided. FIG. 2 shows the third embodiment.

Specifically, the third embodiment of the piezoelectric sensor is the same in structure as the previous first embodiment except that an aluminum oxide plate with a thickness of 0.3 to 0.8 mm and a diameter of about 12 mm is interposed as lower member 33 between vessel 31 and piezoelectric element 13. As means for securing the alumina plate 33 to the vessel 31 and means for securing the piezoelectric element 13 to the alumina plate 33, the epoxy type adhesive 15 as noted above is used. The coefficient of thermal expansion of the alumina plate 33 is $8 \times 10^{-6}/°C$.

As in the first embodiment, the sensitivity-temperature characteristic of the third embodiment of the piezoelectric sensor was measured. At main measurement temperatures, the sensitivity-temperature characteristic change rate of the third embodiment of the piezoelectric sensor was 0% at $-40°$ C., 0% at $+100°$ C. and $-5\%$ at $+150°$ C. Similar characteristics were obtained with samples obtained by changing the thickness of the lower member 33. FIG. 4 shows the sensitivity-temperature characteristic of the samples of the third embodiment by a curve II as well as the first embodiment.

In case when steatite or PZT type ceramics were used for the lower member, similar results to those in the third embodiment were obtained.

4. FOURTH EMBODIMENT

Figure 3:
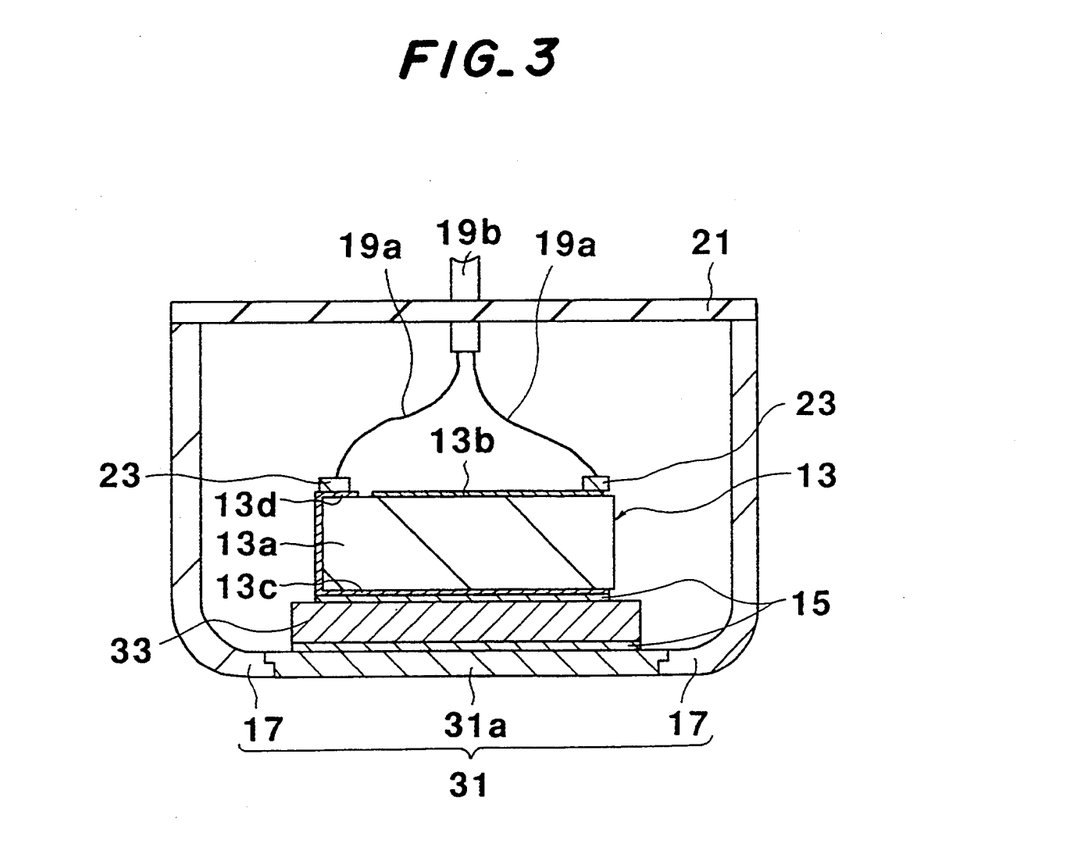
FIG. 3 is a sectional view showing a fourth embodiment of the piezoelectric sensor according to the invention.

FIG. 3 is a sectional view for explaining the fourth embodiment of the piezoelectric sensor. In this fourth embodiment of the piezoelectric sensor, vessel 31 as the support has a portion 31a, which faces piezoelectric element 13, made of the Fe—Ni alloy noted above, while the other portion 17 (which is also referred to as "thermal expansion coefficient consideration-free portion") is made of iron. For the remainder, the structure is the same as the third embodiment. Such a special vessel is obtained by removing a bottom portion of comparative example vessel and bonding a separately prepared disk of Fe—Ni alloy noted above to the vessel such as to occupy the space produced by the removal.

The sensitivity-temperature characteristic of the fourth embodiment of the piezoelectric sensor was found to be the same as that of the third embodiment.

COMPARATIVE EXAMPLE 1

In this comparative example, each piezoelectric sensor was produced in the same way as in the first embodiment except that iron (i.e., two samples obtained by hot and cold rolling, respectively), aluminum and bronze are each used as the material of vessel 31, and as in the first embodiment the sensitivity-temperature characteristic measurement is done. The coefficient of thermal expansion of each of the materials used in this comparative example is $1.2 \times 10^{-5}/°C$. with the hot rolled iron, roughly the same as that of the hot rolled iron with the cold rolled iron, $2.4 \times 10^{-5}/°C$. with aluminum, and $1.8 \times 10^{-5}/°C$. with bronze. In either case, the thermal expansion coefficient is less by at least one order of magnitude than that of the piezoelectric body (PZT) used.

At main measurement temperatures, the sensitivity-temperature characteristic change rate of a typical piezoelectric sensor with the vessel thereof made of the cold rolled iron in the comparative example was $-7\%$ at $-40°$ C., $-30\%$ at $+100°$ C. and $-50\%$ at $+150°$ C. FIG. 4 shows this characteristic by a curve III. It was found that the sensitivity-temperature characteristics of the piezoelectric sensors of the other comparative examples were substantially the same when the vessel was made of cold rolled iron.

It will be evident from the results in the first to fourth embodiments and Comparative Example 1 that by making the support of the piezoelectric element of a material having a coefficient of thermal expansion equal to or near that of the piezoelectric body, the sensitivity-temperature characteristic can be improved over to the other arrangements. Further, among the embodiments, the sensitivity-temperature characteristic can be improved by using the lower member. The characteristic improvement obtainable by the use of the lower member may be caused by such as substantial increase of the thickness of the support produced as a lamination of layers of different materials.

5. FIFTH EMBODIMENT

Figure 5:
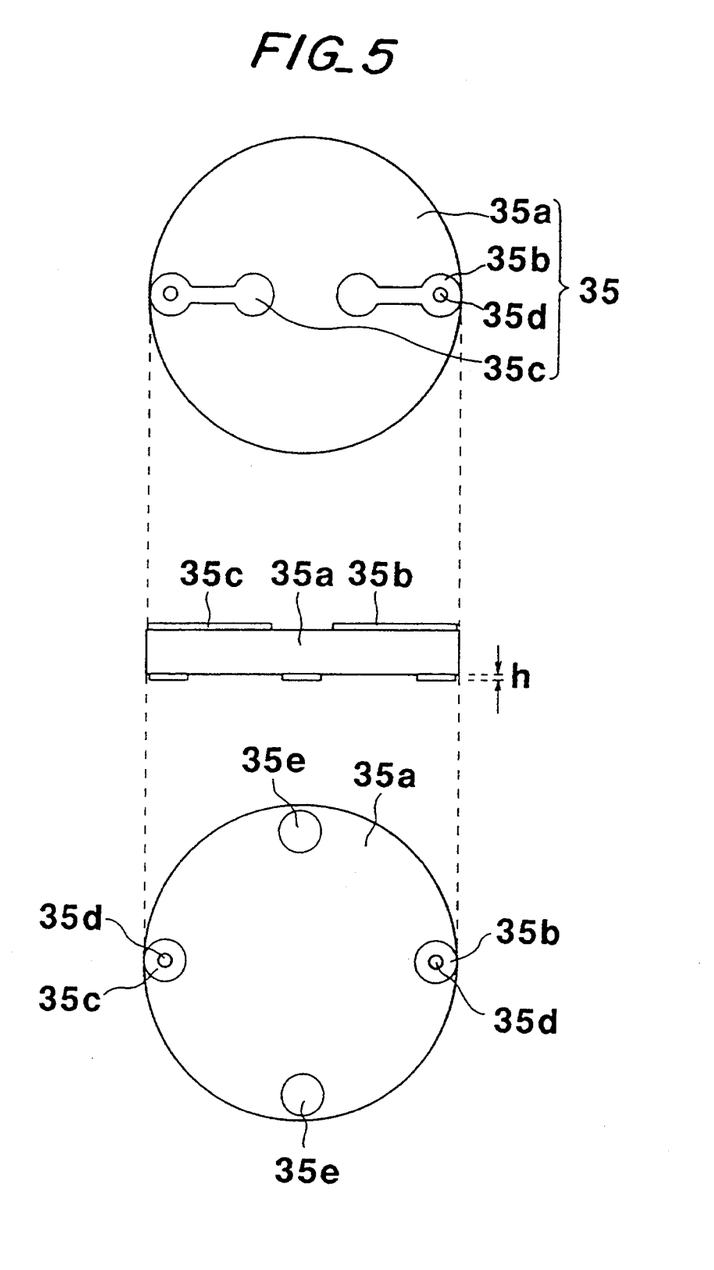
FIG. 5 is a view for explaining an upper member.
Figure 6:
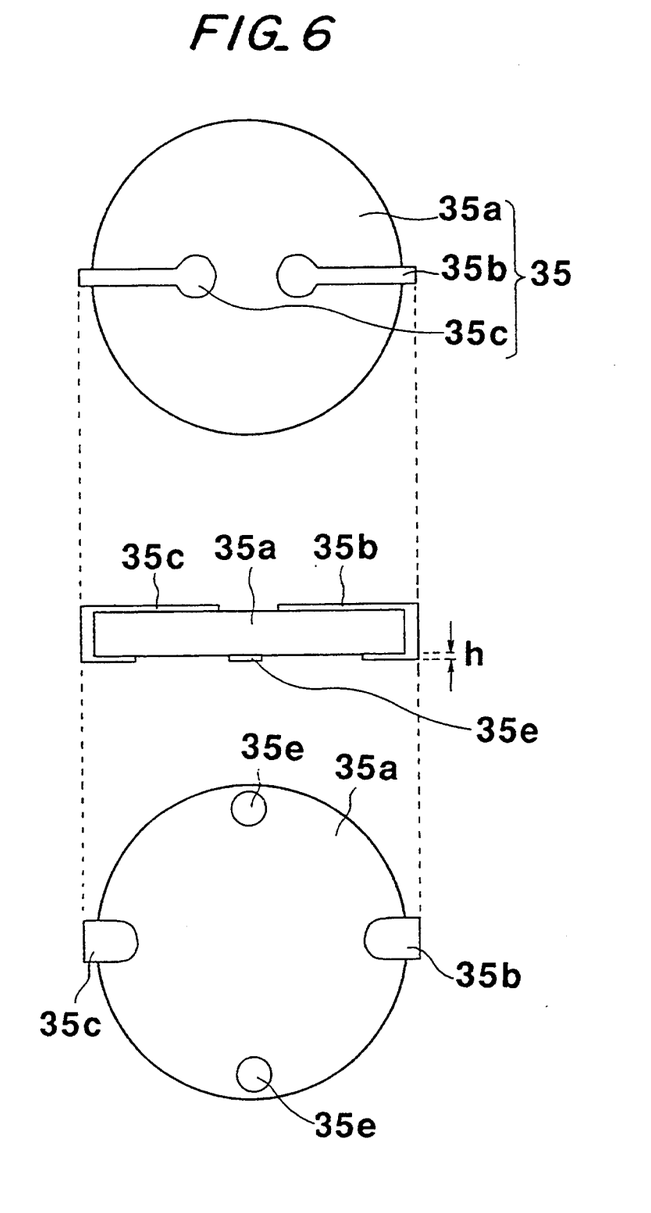
FIG. 6 is a view for explaining a different example of upper member.
Figure 7A:
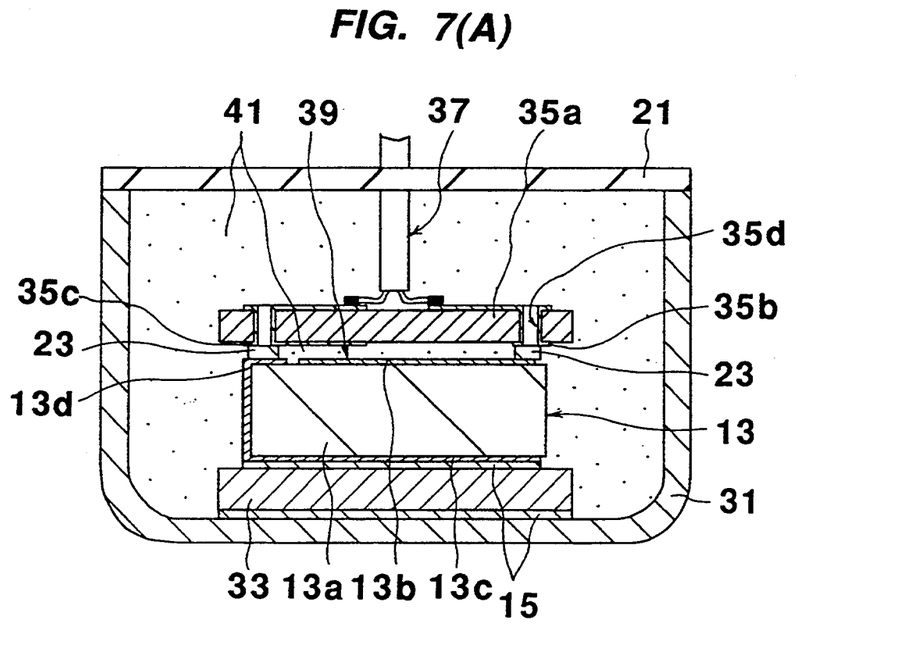
FIG. 7(A) is a sectional view showing a fifth embodiment of the piezoelectric sensor according to the invention.
Figure 7B:
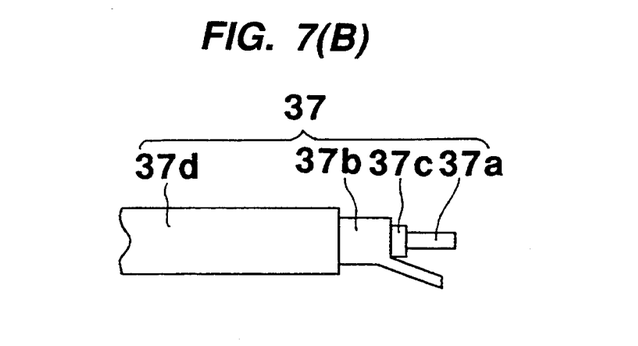
FIG. 7(B) is a view showing an outer wiring used in the fifth embodiment.
Figure 8:
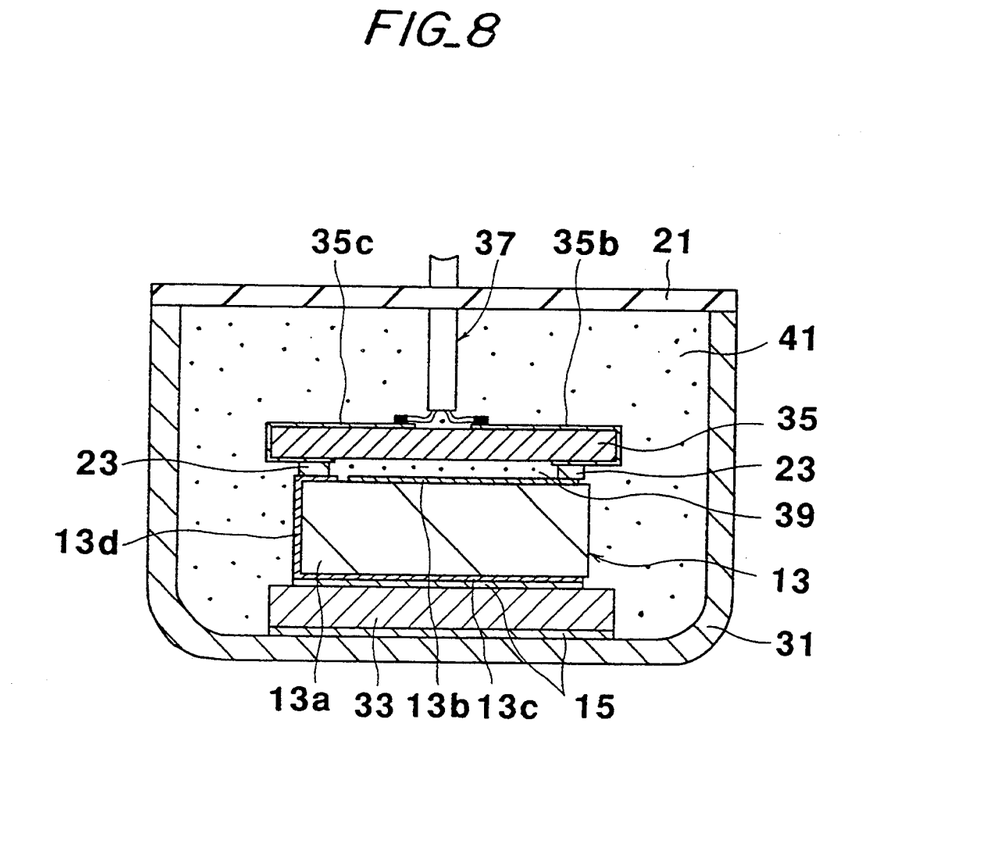
FIG. 8 is a sectional view showing a modification of the fifth embodiment.

This embodiment involves using the upper member, using no inner leads, and resin sealing the piezoelectric element and its neighboring portion (with the resin in direct contact with the piezoelectric element). FIGS. 5 to 8 show the embodiment. Specifically, FIG. 5 shows a top view, a side view and a bottom view for explaining the upper member that is used. FIG. 6 shows a top view, a side view and a bottom view for explaining a different example of the upper member. FIG. 7(A) is a sectional view showing the fifth embodiment of the piezoelectric sensor using the upper member shown in FIG. 5. FIG. 7(B) is a view showing outer wiring 37 in detail. FIG. 8 is a sectional view showing the fifth embodiment of the piezoelectric sensor using the upper member shown in FIG. 6.

As shown in FIGS. 5 and 6, the upper member 35 in either case comprises an alumina plate 35a, which has a diameter of about 12 mm and a thickness of 3 mm, and electrodes 35b and 35c provided on the front and back sides of the alumina plate such as to correspond to a first and a second electrode 13b and 13c of piezoelectric element 13. In the upper member shown in FIG. 5, alumina plate 35a is formed with or includes through holes 35d, and the electrodes 35b and 35c are provided therethrough. The example of FIG. 5 concerns a general through hole wiring structure with a space formed along the axis of each through hole 35d. However, it is possible to fill the through hole 35d with the material of the electrode 35b (or 35c). In the upper member shown in FIG. 6, the electrodes 35b and 35c such that they extend along and across the alumina plate 35a. In order to improve the seating of each upper member 35, it is possible to provide a raised portion 35e at a suitable position on the surface of the member 35 on the side of the piezoelectric element 13 such that it has substantially the same height at that of the electrodes 35b and 35c (as labeled h in FIGS. 5 and 6).

The outer wiring 37, as shown in FIG. 7(B), is a sealed wire 37 comprising an inner conductor (core wire) 37a, an outer conductor 37b, an insulator 37c insulating the inner and outer conductors, and a cover (i.e., insulator) 37d covering the outer conductor 37b. Preferably, inner conductor 37a has a diameter of 0.6 mm, outer conductor 37b has a diameter of 1.4 mm, and the diameter of the wiring 37 is 2 mm. The outer wiring 37 is sufficiently thick compared to the inner leads 19a used in the first to fourth embodiments and comparative example.

Referring to FIGS. 7 and 8, the lower member 33 is secured with the epoxy type adhesive 15 noted above to the vessel 31. The piezoelectric element 13 is then secured with the epoxy type adhesive 15 to the lower member 33. The upper member 35 noted above is then secured to the piezoelectric element 13 by soldering the piezoelectric element side electrodes and the electrodes on the side of the upper member 35 with solder 23. As a result, a space or separation region 39 is formed between the piezoelectric element 13 and upper member 35 due to the connections of the electrodes. Subsequently, the inner and outer conductors 37a and 37b of the outer wiring 37 are connected, by soldering for instance, to the electrode portions of the upper member 35 on the side thereof opposite the piezoelectric element 13. Afterwards, the space in the vessel other than those occupied by the piezoelectric element and so forth is filled with silicone rubber type resin with a thermal expansion coefficient of $2 \times 10^{-4}/°C.$, thus sealing the piezoelectric element and so forth. Thus, two different piezoelectric sensors of the fifth embodiment are obtained (the one corresponding to the electrode structure of the upper member 35 with through holes and the other without through holes).

In the structure of the fifth embodiment, the resin laterally enters the space 39 between the piezoelectric element 13 and upper member 25, and thus the space 39 is fully or partly filled with the resin.

Figure 9:
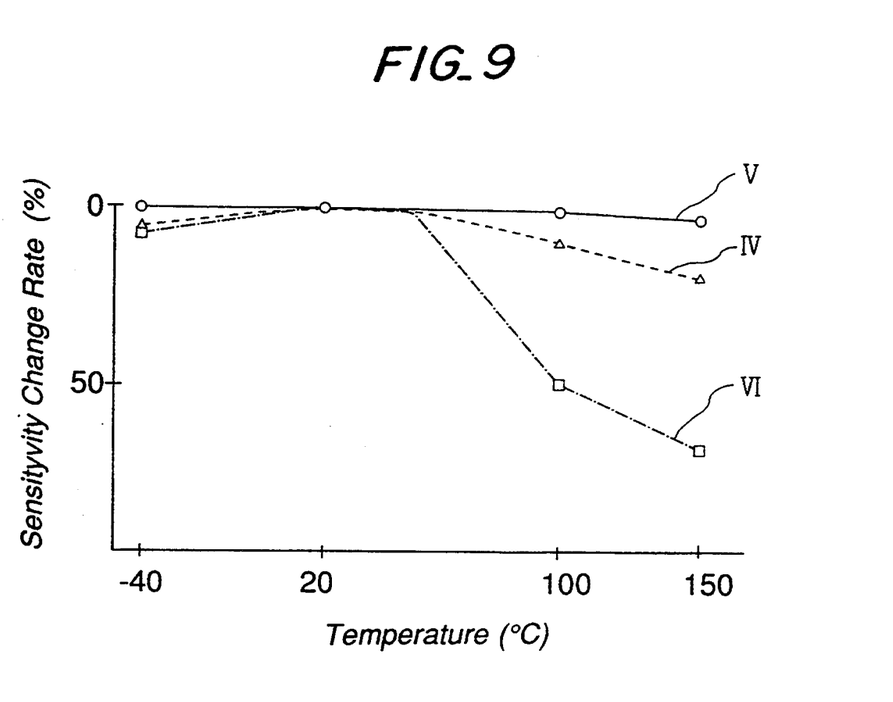
FIG. 9 is a graph showing results of experiments considering upper member and seal member as well in the fifth and sixth embodiments and a comparative example.

As in the first embodiment, the sensitivity-temperature characteristic of each piezoelectric sensor of the fifth embodiment is measured. At main measurement temperatures, the sensitivity-temperature characteristic change rate of the piezoelectric sensors in the fifth embodiment was $-5\%$ at $-40°$ C., $-10\%$ at $+100°$ C. and $-20\%$ at $+150°$ C. This characteristic is shown in FIG. 9 by a curve IV in the same manner as in FIG. 4. FIG. 9 also shows the characteristics of the following sixth embodiment and Comparative Example 2.

The characteristic of the fifth embodiment is inferior to those of the first to fourth embodiments. This is thought to be due to the contact of the sealing resin mainly with the periphery of the piezoelectric element.

6. SIXTH EMBODIMENT

This embodiment involves using an upper member, using no inner leads, and resin sealing the piezoelectric element part and so forth (but avoiding direct contact of resin with the piezoelectric element).

Figure 10:
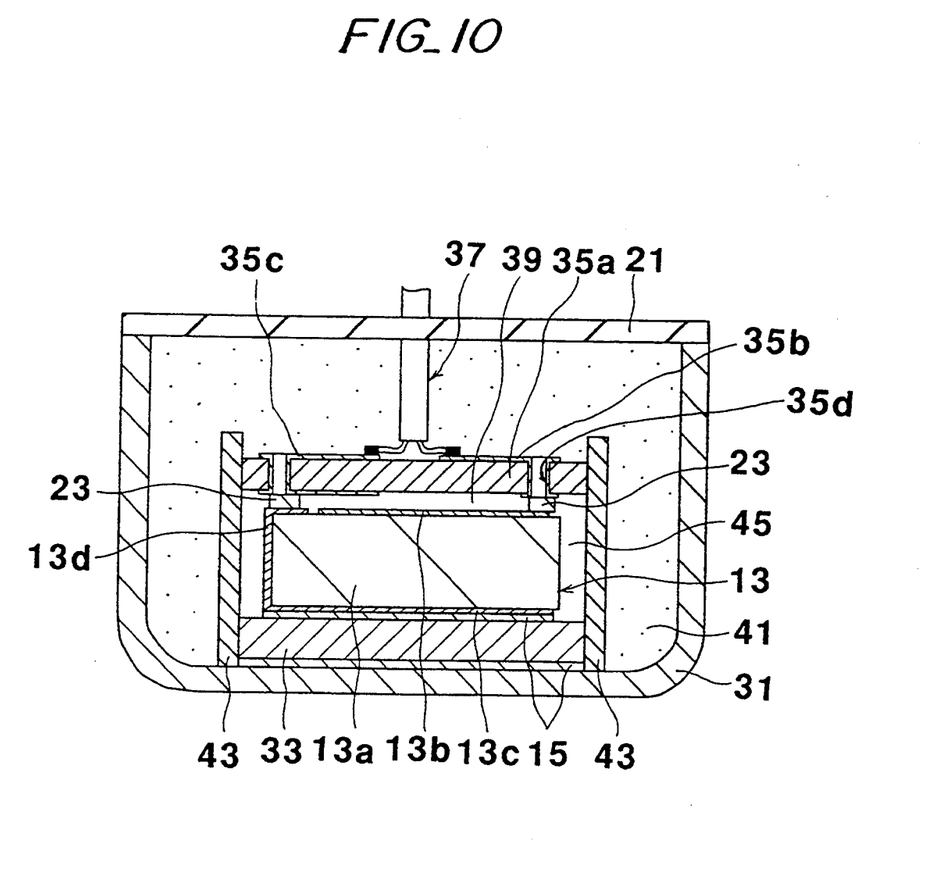
FIG. 10 is a view showing the sixth embodiment of the piezoelectric sensor according to the invention.

FIG. 10 is a sectional view for explaining the sixth embodiment of the piezoelectric sensor.

In the process of the sensor manufacture described earlier in connection with the fifth embodiment, after connecting outer wiring 37 to upper member 35 and before charging vessel 31 with the sealing material 41, a resin tube capable of thermal shrinkage is disposed as a cover member 43 to surround the entire periphery of the lamination or arrangement comprising the lower member 33, piezoelectric element 13 and upper member 35, thus forming a sealed space around the piezoelectric element. Thereafter, the resin is introduced as in the fifth embodiment, thus obtaining the sixth embodiment of the piezoelectric sensor. As the thermally shrinkable tube is used "Sumitube" (a trade name by Sumitomo Denki Kogyo).

In the structure of the sixth embodiment, the lower and upper members 33 and 35 have greater plan dimensions than those of the piezoelectric element 13. Thus, the thermally shrinkable tube is fitted on the lower and upper members 33 and 35 with a space or separation region 45 formed around the piezoelectric element (as shown in FIG. 10). In addition, the space 39 between the piezoelectric element 13 and upper member 35 is preserved. Thus, a piezoelectric sensor is obtained in which the piezoelectric element 13 is covered by the sealing material 41 with spaces held adjacent the top surface and periphery of the piezoelectric element 13, and in which the support structure for the piezoelectric element is made of a material having a predetermined coefficient of thermal expansion.

As in the first embodiment, the sensitivity-temperature characteristic of the sixth embodiment was measured. At main measurement temperatures, the sensitivity-temperature characteristic change rate of the sixth embodiment of the piezoelectric sensor was 0% at $-40°$ C., 0% at $+100°$ C. and $-3\%$ at $+150°$ C. The characteristic is shown in FIG. 9 as a curve V.

COMPARATIVE EXAMPLE 2

In Comparative Example 2, the piezoelectric sensor is obtained such that it has the structure in Comparative Example 1 except that the piezoelectric element is sealed in the vessel thereof by charging the resin used in the fifth and sixth embodiments.

As in the first embodiment, the sensitivity-temperature characteristic of Comparative Example 2 is measured. At main measurement temperatures, the sensitivity-temperature characteristic of Comparative Example 2 of the piezoelectric sensor is $-8\%$ at $-40°$ C., $-50\%$ at $+100°$ C. and $-70\%$ at $+150°$ C. This characteristic is shown in FIG. 9 by a curve VI.

It will be seen that the structure of the sixth embodiment has the best characteristic among the above embodiments and comparative examples.

Figure 11:
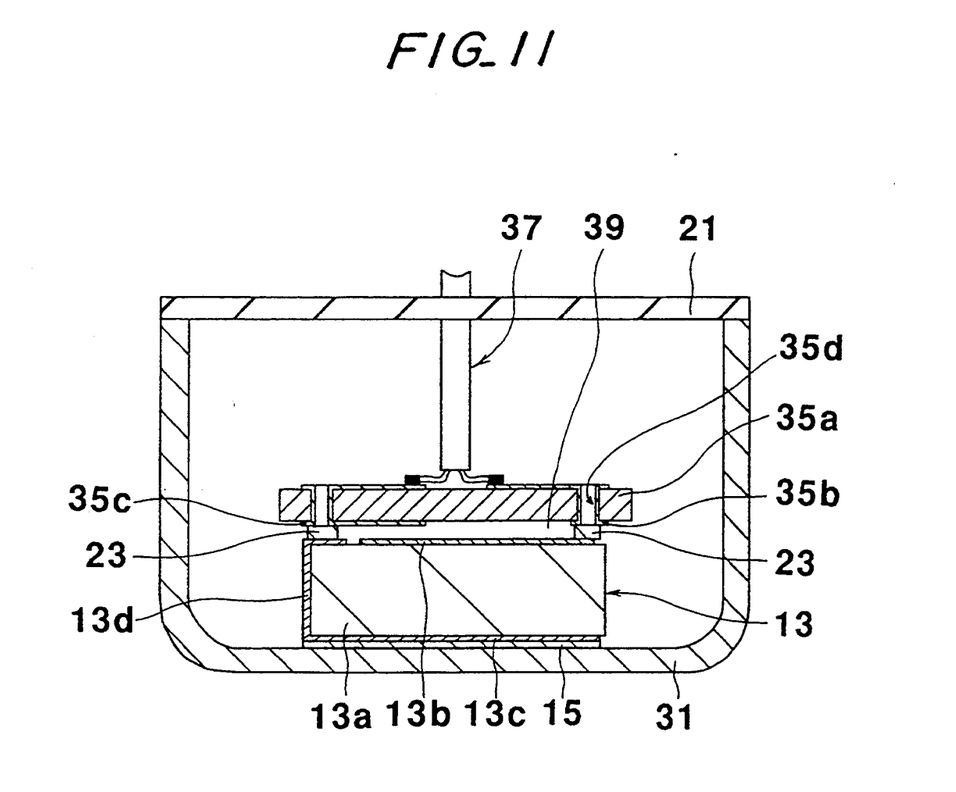
FIG. 11 is a sectional view showing a modification of the sixth embodiment.

While various embodiments of the piezoelectric sensor have now been described, these embodiments are by no means limitative. For example, as shown in FIG. 11, upper member 35 may be incorporated in the structure of the first embodiment (see FIG. 1), and electric wire 37 having a greater diameter than in the prior art may be used. With this structure, the characteristic will be obviously improved compared to the prior art. Further, the structure of the fifth embodiment (see FIG. 7 or 8), except that the resin sealing is not made, will obviously provide an improved characteristic compared to the prior art.

The shape, size and material of the piezoelectric element are not limited to those mentioned above but may be suitably selected in accordance with the design. For example, in the case of using piezoelectric ceramics other shapes and dimensions are detailed in, for instance, "Technical Information Piezoelectric Ceramics", Feb. 20, 1988, Third Edition, Oki Ceramic Kogyo Kabushiki Kaisha. Further, it is possible to use liquid crystals and the like as the piezoelectric material. In this case, the material of the support may be selected in correspondence to the coefficient of thermal expansion of the piezoelectric material.

As has been made obvious in the foregoing, with the piezoelectric sensor according to the invention the stress generated due to the difference of the coefficient of thermal expansion between the support in contact with the piezoelectric element and the piezoelectric body can be reduced in comparison to that in the prior art. It is thus possible to improve the temperature dependency of the sensitivity of the piezoelectric sensor compared to the prior art. Further, in applications of the sensor in environments subject to great temperature changes, there is no need of using any special protector, and thus it is possible to avoid sensor size increase.

Further, in the case of the structure in which the upper member is provided above the piezoelectric element with an intervening space or separation provided between the two and with the outer wiring connected to the upper member, the stress from above the piezoelectric element is substantially blocked or relieved by the upper member, and thus it is possible to provide reinforcement of the outer wiring (for instance with electric wire having a large diameter or a printed circuit board). It is thus possible to improve the durability of the sensor.

Further, with a structure in which the lower and upper members are used, the piezoelectric element is covered with a space or separation provided adjacent it, and the piezoelectric element is sealed with a sealing material, it is possible to mold the piezoelectric element with a space or separation held adjacent the top surface and periphery of the piezoelectric element. It is thus possible to shield the piezoelectric element from the working environment in a state with reduced adverse effects of the sealing material on the piezoelectric element. Thus, it is possible to provide a piezoelectric sensor which can be used with satisfactory durability even in severe environments.

What is claimed is:

1. A piezoelectric sensor comprising a piezoelectric element and a support with said piezoelectric element secured thereto for obtaining a measurement signal from an object under measurement through said support, wherein:

said support is entirely or partly made of a material having a coefficient of thermal expansion equal to or near the coefficient of thermal expansion of a piezoelectric body used for said piezoelectric element; and wherein said piezoelectric sensor further comprises an upper member provided on the surface of said piezoelectric sensor on the side thereof opposite said support, said upper member being made of a material having a coefficient of thermal expansion equal to or near the coefficient of thermal expansion used for said piezoelectric element and having electrodes connected to electrodes of said piezoelectric element, said piezoelectric element and said upper member being spaced apart and facing each other, outer leads being connected to electrodes of said upper member.

2. The piezoelectric sensor according to claim 1, wherein the electric connection between said piezoelectric element and said upper member is done by the connection between the electrodes of said piezoelectric element and the electrodes of said upper member.

3. The piezoelectric sensor according to claim 1, wherein said upper member faces said piezoelectric element via an intervening space.

4. The piezoelectric sensor according to claim 1, wherein said upper member faces said piezoelectric element via an intervening insulator.

5. The piezoelectric sensor according to claim 1, wherein the periphery of said piezoelectric element and said lower and upper members is covered by an insulator.

6. The piezoelectric sensor according to claim 4 or 5, wherein said insulator is silicon rubber type resin.

7. A piezoelectric sensor comprising a piezoelectric element and a support with said piezoelectric element secured thereto for obtaining a measurement signal from an object under measurement through said support, wherein:

said support is entirely or partly made of a material having a coefficient of thermal expansion equal to or near the coefficient of thermal expansion of a piezoelectric body used for said piezoelectric element;

said support includes a vessel accommodating said piezoelectric element and a lower membrane interposed between said vessel and said piezoelectric element, at least said lower membrane being made of a material having said coefficient of thermal expansion;

said piezoelectric sensor further comprises an upper member provided on the surface of said piezoelectric sensor on the side thereof opposite said support, said upper member being made of a material having a coefficient of thermal expansion equal to or near the coefficient of thermal expansion used for said piezoelectric element and having electrodes connected to electrodes of said piezoelectric element, said piezoelectric element and said upper member being spaced apart and facing each other, outer leads being connected to electrodes of said upper member; and wherein said piezoelectric sensor further comprises a cover member covering the periphery of a lamination including said lower member, said piezoelectric element and said upper member such that a space is secured around the periphery of said piezoelectric element, said lamination covered by said cover member being sealed by a sealing material.

8. The piezoelectric sensor according to claim 7, wherein said lower and upper members have plan dimensions greater than the plan dimensions of said piezoelectric element, said space around the periphery of said piezoelectric element by making use of the difference of said plan dimensions.

* * * * *